(12) United States Patent
Staines

(10) Patent No.: US 6,399,011 B1
(45) Date of Patent: Jun. 4, 2002

(54) METHOD OF BIAXIALLY ALIGNING CRYSTALLINE MATERIAL

(75) Inventor: Michael Staines, Eastbourne (NZ)

(73) Assignee: Industrial Research Limited (NZ)

( * ) Notice: Subject to any disclaimer, the term of this patent is extended or adjusted under 35 U.S.C. 154(b) by 0 days.

(21) Appl. No.: 09/051,156
(22) PCT Filed: Oct. 2, 1996
(86) PCT No.: PCT/NZ96/00108
  § 371 (c)(1),
  (2), (4) Date: Sep. 21, 1998
(87) PCT Pub. No.: WO97/15067
  PCT Pub. Date: Apr. 24, 1997

(30) Foreign Application Priority Data

Oct. 3, 1995 (NZ) .............................................. 280163

(51) Int. Cl.[7] .............................. H05B 6/00; H01L 39/24
(52) U.S. Cl. ........................ 264/427; 264/435; 427/547; 505/400
(58) Field of Search ................................ 264/427, 435; 505/400; 427/547

(56) References Cited

U.S. PATENT DOCUMENTS

| | | | | |
|---|---|---|---|---|
| 4,939,121 A | * | 7/1990 | Rybka | ........................... 505/1 |
| 4,990,493 A | * | 2/1991 | Lay | ................................. 505/1 |
| 5,045,528 A | * | 9/1991 | Tolt et al. | ....................... 505/1 |
| 5,114,905 A | * | 5/1992 | Giessen et al. | ................ 505/1 |
| 5,280,011 A |  | 1/1994 | Kraitsberg | ..................... 505/1 |
| 5,529,981 A |  | 6/1996 | Holloway | ................... 505/400 |

* cited by examiner

Primary Examiner—Christopher A. Fiorilla
(74) Attorney, Agent, or Firm—Dann, Dorfman, Herrell and Skillman, P.C.

(57) ABSTRACT

A method of inducing biaxial particle alignment in a body of crystalline particles of a material such as a high temperature superconducting material, having anisotropic magnetic susceptibility so that at least a major portion of the crystalline particles have at least two crystalline axes generally parallel, comprises subjecting the particles to a magnetic field which varies cyclically relative to the body of crystalline particles with time, and which has an average magnitude which is a maximum in a first direction, a lower average magnitude in a second direction generally orthogonal to said first direction and a minimum or zero average magnitude in a third direction generally orthogonal to said first and second directions. Alignment of the axis of maximum magnetic susceptibility of the particles generally with the direction of maximum average magnitude and the axis of minimum magnetic susceptibility of the particles generally with the minimum or zero average magnitude direction is induced.

16 Claims, 7 Drawing Sheets

METHOD OF BIAXIALLY ALIGNING CRYSTALLINE MATERIAL

FIELD OF INVENTION

The invention comprises a method of inducting biaxial particulate alignment in a body of crystalline particles possessing anisotropic magnetic susceptibility, such as high temperature superconducting material.

BACKGROUND

Many High-$T_c$ Superconducting Cuprates (HTSC) are known to have superconducting transition temperatures, $T_c$ exceeding the temperature at which liquid nitrogen boil, 77K. As such they have a potentially large number of applications ranging from power generation, distribution, transformation and control, to high-field magnets, motors, body scanners, telecommunication and electronics. A high $T_c$ value alone does not guarantee the utility of these HTSC at 77K or higher temperatures. Often these applications require large critical currents in the HTSC and this is not achieved unless the crystalline grains or particles of the HTSC are crystallographically aligned. This is commonly achieved in thin-films wherein the HTSC material is deposited on a substrate in such as way as to obtain crystallographic alignment of the material. However, thin film, while supporting very high critical current densities, $J_c$ do not carry a very high absolute critical current, $I_c$ because they are so thin.

Superconducting wires or other components which use bulk superconducting material can in principle support much higher $I_c$ values provided they can be textured to achieve high $J_c$ values. In processing HTSC to for such wires or similar, aligning the crystalline particles of the HTSC so that a major portion or ore of the particles have at least one similar axis parallel such as the c-axis, is commonly referred to as texturing the material. It has become apparent, at least for some and probably all HTSC, that crystallographic alignment along one common axis or monoaxial texture, may be insufficient to achieve high critical current density and the full biaxial texture in which two similar axes of the crystalline particles, such as the c- and b-axes, are aligned is preferable. An example of monoaxial texture of HTSC achieved by magnetic means is given by Tkaczyk and Lay (J. Mater. Res. 5 (1990) 1368) in which no significant improvement over unaligned material was seen.

It is known that such biaxial texturing or alignment can be achieved by linear melt processing in which the HTSC material is pulled slowly through a temperature gradient so that part of the material resides above the partial melting point and another part lies below, and the melt/solid interface is slowly displaced along the length of the material leaving behind dense, textured material in its path. This process, however, is difficult to control and extremely slow, producing biaxially textured material at a rate as low as 1 mm/hour. Linear melt processing is considered unsuitable for manufacturing long length wires exceeding 100 m or, worse still, 1 km.

Efforts have also been made to produce biaxial texture by a combination of monoaxial magnetic alignment and mechanical treatments such as pressing or rolling (Chen et al, Appl. Phys. Lett. 58 (1991) 531). However, the difficulty of achieving bulk alignment by mechanical means has prevented significant gains in critical current from being demonstrated.

SUMMARY OF INVENTION

The invention provides an improved or at least alternative method of inducing biaxial particulate alignment in a body of crystalline particles processing anisotropic magnetic susceptibility, such as high temperature superconducting material, which is useful as a step in forming bulk HTSC components such as wires, tapes, or other conducting elements, or other components.

In broad terms the invention comprises a method inducing biaxial particulate alignment in a body of crystalline particles having anisotropic magnetic susceptibility, so that at least a major portion of the crystalline particles have at least two crystalline axes generally parallel, comprising subjecting the particles to a magnetic field which varies cyclically relative to the body of crystalline particles with time and which has an average magnitude which is a maximum in a first direction, lower in a second generally orthogonal direction, and a minimum or zero in a third direction generally orthogonal to the first and second directions, to induce alignment of the axis of maximum magnetic susceptibility of the particles with the field direction of maximum average magnitude and the axis of minimum magnetic susceptibility with the field direction of minimum or zero average magnitude.

In one for of the invention a time varying magnetic field relative to the crystalline particles is produced by causing cycles of relative rotation between the body of crystalline particles and a magnetic field with the crystalline particles being subjected to the magnetic field in one orientation between the body of crystalline particles and the magnetic field for a time longer than the crystalline particles are subjected to the magnetic field in a second such orientation. The body of crystalline particles may be rotated relative to a magnetic field or the magnetic field may be rotated relative to the crystalline particles.

The relative may be cyclical between two positions with, in each cycle, the time at one position being less than the time at the other position. The angle of relative rotation may be between 0° and 180° and is preferably about 90°. Alternatively the relative rotation may be cyclical between three positions. The body of particles may be rotated within a magnetic field, between one position in which the body of particles spends most time so that the direction of the magnetic field relative to the particles in this position defines the direction of maximum average field magnitude relative to the particles, and two positions on either side of the maximum magnitude position, in which the particles spend less time. In these positions the angle of the field relative to the maximum average magnitude field direction may be between 0° and 180° and is preferably about 90°. For example biaxial alignment may be induced by cyclically rotating a body of particles about an axis first by 90° with respect to an initial orientation in which the body of particles spends most time. The body of particles is then returned to the initial position and then rotated by 90° in the opposite direction, and is then returned to the initial position and the cycle is repeated. The total time spend at the opposite positons (±90°) is less than the time spent at the initial position so that the field direction when the body of particles is in the initial position defines the direction of the maximum average field magnitude relative to the particles. The average field magnitude along an axis parallel to the +90° and −90° positions is lower and the crystalline axis of intermediate magnetic susceptibility of the particles will tend to align along tis axis. The sign reversal of the magnetic field at opposite positions is unimportant for the aligning process as the potential energy of a body in a magnetic field of strength B varies as $B^2$. Initial alignment may be accomplished by holding the body of crystalline particles in the maximum average magnitude position to induce an initial alignment of the crystals with their axis of maximum magnetic susceptibility along this field direction.

In another form of the invention the time varying magnetic field may be a net magnetic field which is the sum of a field in one direction and a field in a second direction, the strength of which field in the second direction varies with time. The direction of the first field relative to the crystalline particles (when the second field is switched off or at a minimum) will generally be the field direction of maximum average magnitude and the crystalline axis of maximum magnetic susceptibility will align in this direction. When the second field is switched on or at a maximum, it adds to the field in the first direction and the direction orthogonal to both the first and second fields is the direction of minimum average magnetic field magnitude, with which the axis of minimum magnetic susceptibility of the particles will align. Alternatively the field in one direction may be switched on while the field in another direction is switched off and vice versa. The field in one direction may be stronger than the field in the other direction or may be on a for a longer time in each cycle.

In another form of the invention a time varying magnetic field relative to the crystalline particles is produced by causing relative translational movement between the body of crystalline particles and a series of electromagnets or permanent magnets oriented alternately in one and the another direction. Either the crystalline particles may be moved relative to the series of magnets or a series of longitudinally arranged magnets may be moved relative to the crystalline particles. Either the body of particles may be moved more slowly past or stopped adjacent each alternate magnet, or alternate magnets may be loner in the direction of movement, or alternate magnets may be of higher strength. The net effect is that the particles are subjected to a magnetic field the direction of which varies with time relative to the particles and which has average magnitude which is a maximum in one direction, lower in a second direction, and zero or a minimum in a third direction, to achieve a common biaxial alignment of the crystalline particles. Instead of a series of magnets, a similar effect may be achieved by appropriate shaping of a magnetic core or by varying the density of windings of an electromagnet along the length of a core, to form a series of magnetic subfields.

The magnetic alignment may be carried out while the crystalline particles are settled through or suspended in an organic liquid, epoxy, polymer solution, molten wax, or other fluid, or a gaseous or liquid flow so that they are free to move under the influence of the applied magnetic fields. Where the crystalline particles are settled through a fluid they will form a sediment of aligned particles. Alternatively the suspension may have the property that, after alignment has been achieved, it can be arrested to preserve the texture, by solidification, curing, polymerisation, or chemical reaction, for example. Alternatively the fluid may be slowly drained off, or partially or completely volatilised or evaporated, or a suspending gaseous or liquid flow may be slowly ceased. Alternatively again the body of crystalline particles may be vibrated while subjected to the magnetic alignment, or the magnetic alignment may be carried out during electrophoretic deposition.

In a preferred form of the invention as applied to rare earth HTSC superconductor the particles used for alignment will be $R_2Ba_4Cu_7O_{15-\delta}$ (where R is Y or a rare earth element) or $RBa_2Cu_{4O8}$ as these particles may be conveniently prepared as detwinned in contrast to $RBa_2Cu_3O_{7-\delta}$ which is typically twinned.

The magnetic alignment of the invention may be carried out using an electromagnet or electromagnets, a permanent magnet or magnets to generate the magnetic field, or using radio frequency or microwave means for example to generate electromagnetic fields.

The magnetic alignment may be carried out on crystalline material crystallising from a melt to induce biaxial texture in the resulting solid, by applying a time varying magnetic field to the crystallising material, and the term "particles" is to be understood accordingly, as including crystal nuclei for example.

DESCRIPTION OF FIGURES

The invention is further described with reference to the accompanying figures, by way of example and without intending to be limiting. In the figures:

FIG. 5d shows the rocking curve for the (0 2 0) diffraction line of a $Y_3Ba_4Cu_7O_{15-\delta}$ sample aligned as described in Example 1.

DESCRIPTION OF PREFERRED FORMS

In the following the crystal axis of maximum magnetic susceptibility is referred to as the M1 axis, the intermediate susceptibility axis as the M2 axis, and the axis of minimum magnetic susceptibility as the M3 axis. The maximum average magnitude magnetic field direction with which the crystal axis M1 will tend to align is denoted B1 and the lower average magnitude field direction along which axis M2 will tend to align is denoted B2.

Figure 1:
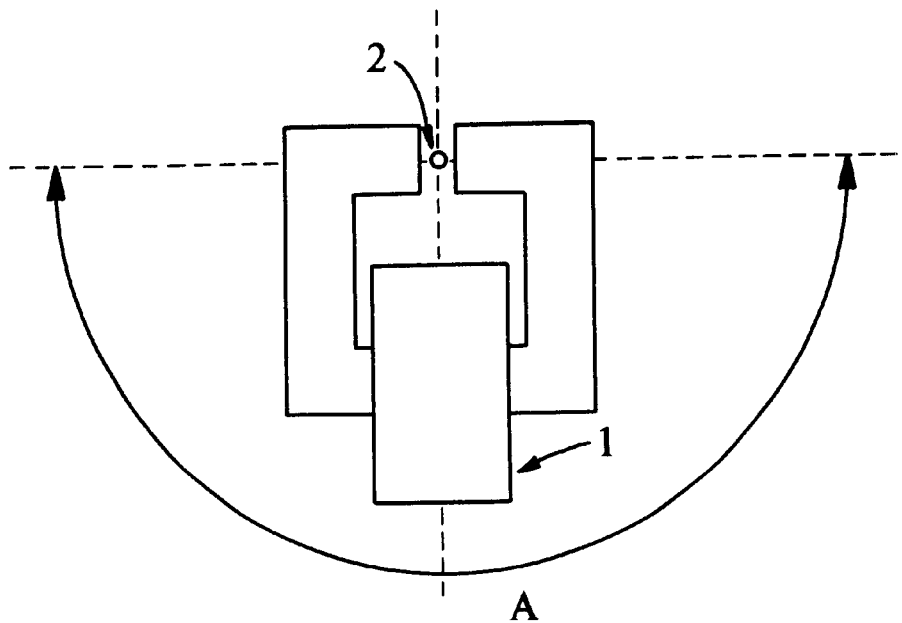
FIG. 1 illustrates inducing biaxial alignment by one preferred form of the method of the invention.

Referring to FIG. 1, in one form an iron-cored electromagnet 1, or an assembly of permanent or trapped-flux magnets or other means providing a magnetic field, is rotated about an axis 2 through the centre of the pole gap as shown, in which a suspension of HTSC particle is positioned or through which the suspension passes. The direction of the M1 alignment is determined b the direction of maximum average magnetic field magnitude. The magnet 1 may be initially held at this orientation to induce an initial uniaxial alignment. To induce a biaxial alignment the magnet is cyclically rotated, as indicated by arrow A, alternately to opposite positions through similar angles of greater than 0°, less than 180° and such as about 90°, with respect to the 0° position for short periods which are also short compared to typical grain orientation times. Rotation between 0° and only one other position such a the +90° position and back may be used. Instead of rotating the magnet relative to the HTSC particles, the body of HTSC particles may be rotated relative to the magnet.

Figure 2A:
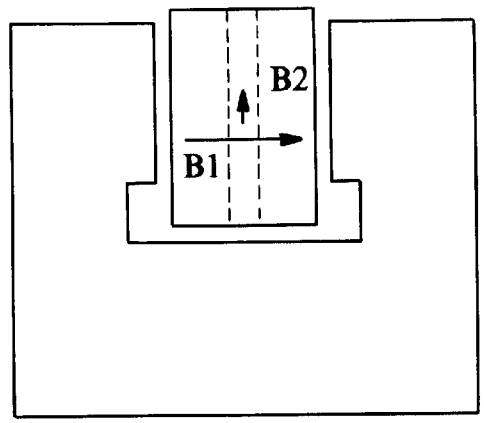
FIGS. 2a and 2b illustrate inducing biaxial alignment by another preferred form of the method of the invention.
Figure 2B:
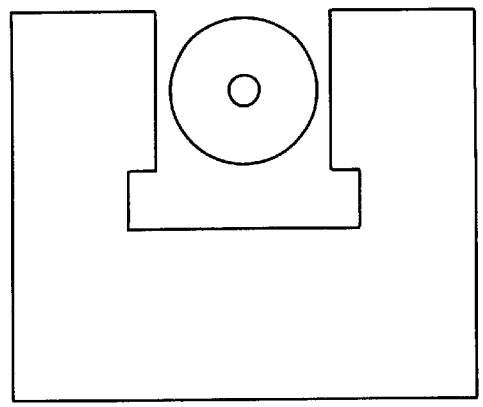

Referring to FIGS. 2a and 2b, in another form a suspension of HTSC particles is positioned in or passed axially through the bore of an air-cored solenoidal electromagnet 3 which is situated between he poles of an iron-cored electromagnet 4. The axis of the solenoid 3 is directed perpendicular to the field generated by the iron-cored magnet 2 as shown. The field direction of the iron-cored magnet 2 extending in direction B1 has the maximum average magnitude and imparts a strong texture to the HTSC particles along crystal axis M1. The solenoid 2 is pulsed with electric current to generate a pulsed or oscillating field in direction B2, with the pulse length short compared with the average grain alignment time, to also align the M2 axis of the crystals along axis B2. The net time varying field to which the crystals are subjected is the sum of the fields from the solenoid 3 and electromagnet 4.

Figure 3:
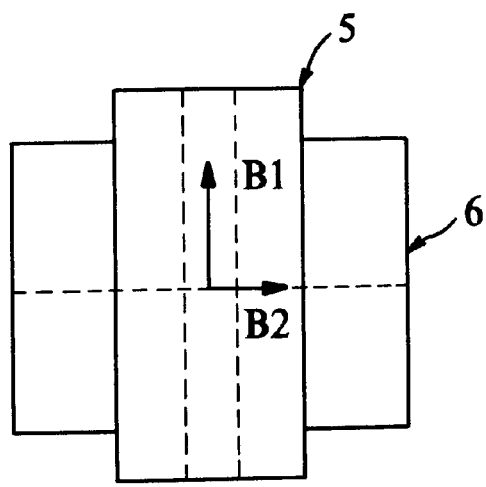
FIG. 3 illustrates inducing biaxial alignment b a further preferred form of the method of the invention.

Referring to FIG. 3, in another form both the initial aligning field B1 and a pulsed field B2 are produced by solenoids or coils 5 and 6. The M1 crystal axis aligns with the field B1 of coil 5 which has higher average magnitude, while coil 6 is pulsed with current to produce a pulsed or oscillating field in direction B2 of lower average magnitude so that the M2 axis of the HTSC crystals aligns along axis B2. Alternatively the solenoid 5 may also be pulsed to produce a stronger pulsed field than coil 6, or a field of similar strength but with a longer duty cycle so as to have a higher average field strength. Again the time varying field to which the crystals are subjected is the sum of the fields from the solenoids 5 and 6.

Figure 4:
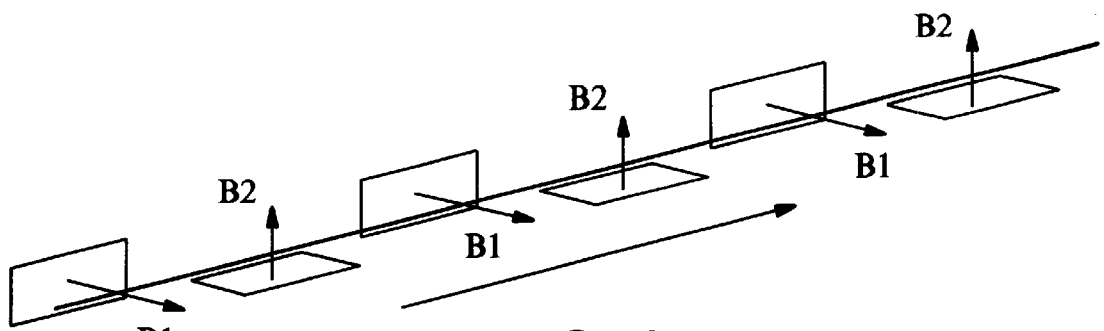
FIG. 4 illustrates inducing biaxial alignment b a further preferred form of the method of the invention.

Referring to FIG. 4, in another form a suspension of the HTSC is moved continuously or stepwise past a series of magnets alternately with field directions B1 and B2. The time spent in the B1 and B2 field regions and/or the relative strengths of the field in the B1 and B2 directions are controlled so that the average field strength in the B2 direction is less than the average field strength in the B1 direction, so that crystal axis M1 aligns with field axis B1 and crystal axis M2 aligns with field axis B2. A similar series of magnetic fields may also be produced by a succession of asymmetrically positioned core segments in a solenoid for example. The net field to which the HTSC is subjected as the HTSC moves past the magnets is a magnetic field the direction of which varies with time with an average magnitude which is a maximum in one direction lower in an orthogonal direction, and zero or minimum in a third direction orthogonal to the tow other directions, which will again induce biaxial magnetic alignment.

In a particularly preferred form of the invention a powdered HTSC such as $R_2Ba_2Cu_3O_{7-\delta}$ or $R_2Ba_4Cu_7O_{15-\delta}$, (where R is for Y or a rare earth element) may be dispersed with the aid of a suitable surfactant in a volatile fluid such as heptane, which is introduced to the inside of a container such as a tube or trough of silver of sintered HTSC, or of ceramic with or without protective layers of materials selected for limited reactivity with the powdered HTSC. The tube or similar containing the dispersed HTSC may then be subjected to biaxial magnetic alignment according to the method of the invention. The tube is ventilated so that the suspension is able to dry after alignment has been achieved. In the case of $Y_2Ba_4Cu_7O_{15-\delta}$, a magnetic texture may be produced in which the b-axis is aligned along the tube length and the c-axis across the tube length, for example.

In another particularly preferred form of the invention a powdered HTSC may be suspended, optionally with the aid of a suitable surfactant, in a volatile fluid which is coated on the exterior of a substrate component such as metal tape which is then passed continuously through a region or zone in which the tape carrying the fluid suspending the HTSC particles is subjected to biaxial magnetic alignment by a time varying magnetic field according to the method of the invention, to biaxially texture the HTSC particles. The solvent may be evaporated to fix the aligned HTSC particles to the tape while maintaining their alignment, or may sediment through the thin solvent layer on the tape, or may be deposited on the tape by electrophoresis.

The following examples further illustrate the invention:

EXAMPLE 1

Figure 5A:
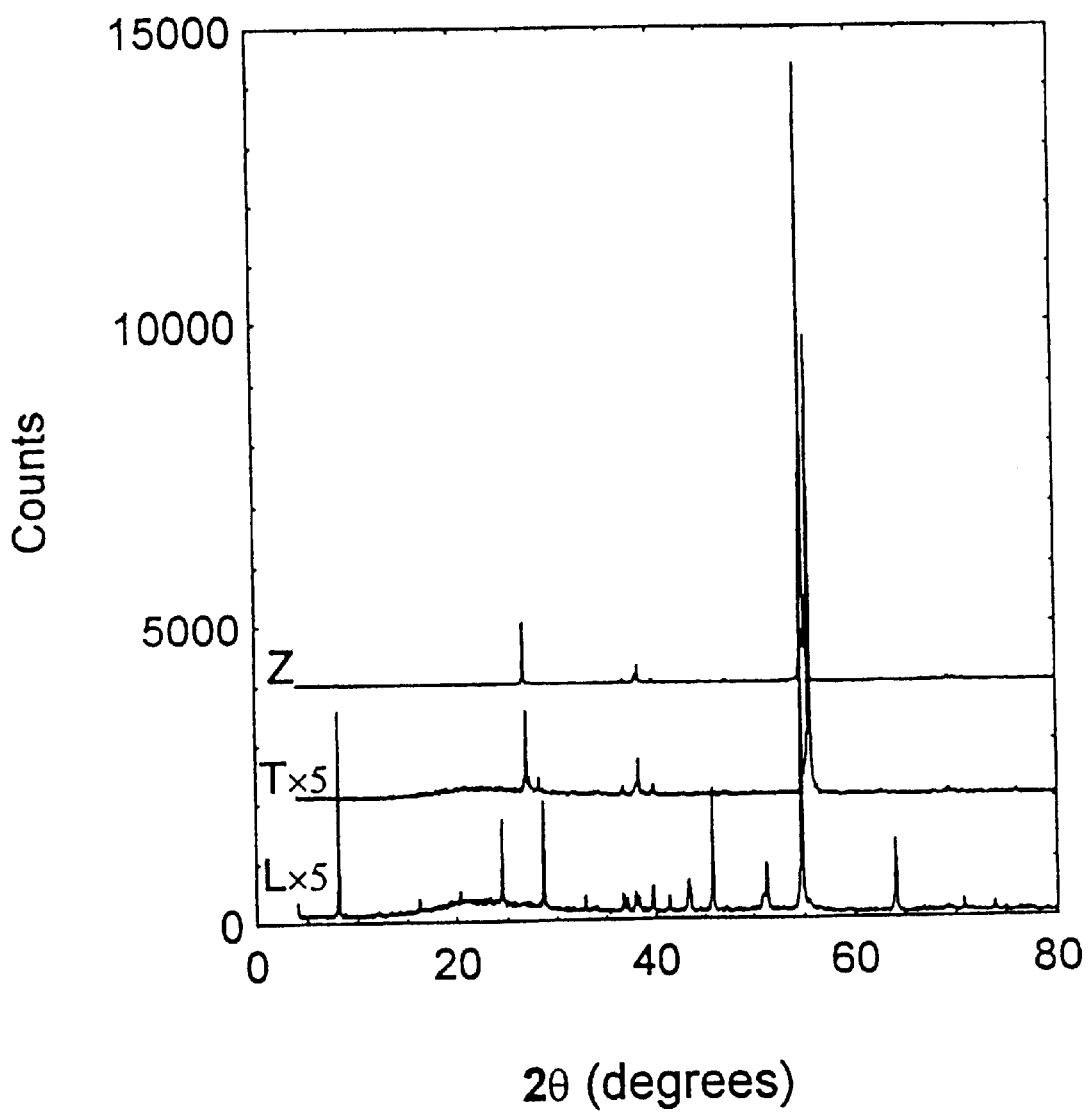
FIGS. 5a, 5b, and 5c and 5d show XRD traces measured on a sample of $Dy_2Ba_4Cu_7O_{15-\delta}$ biaxially textured as described in Example 1—L shows the strong (00l) lines for the sample face perpendicular to the field direction, T denotes the trace for the surface normal to the horizontal transverse direction and Z for the surface normal to the vertical transverse direction. Differences between these traces reveal biaxial texture.
Figure 5B:
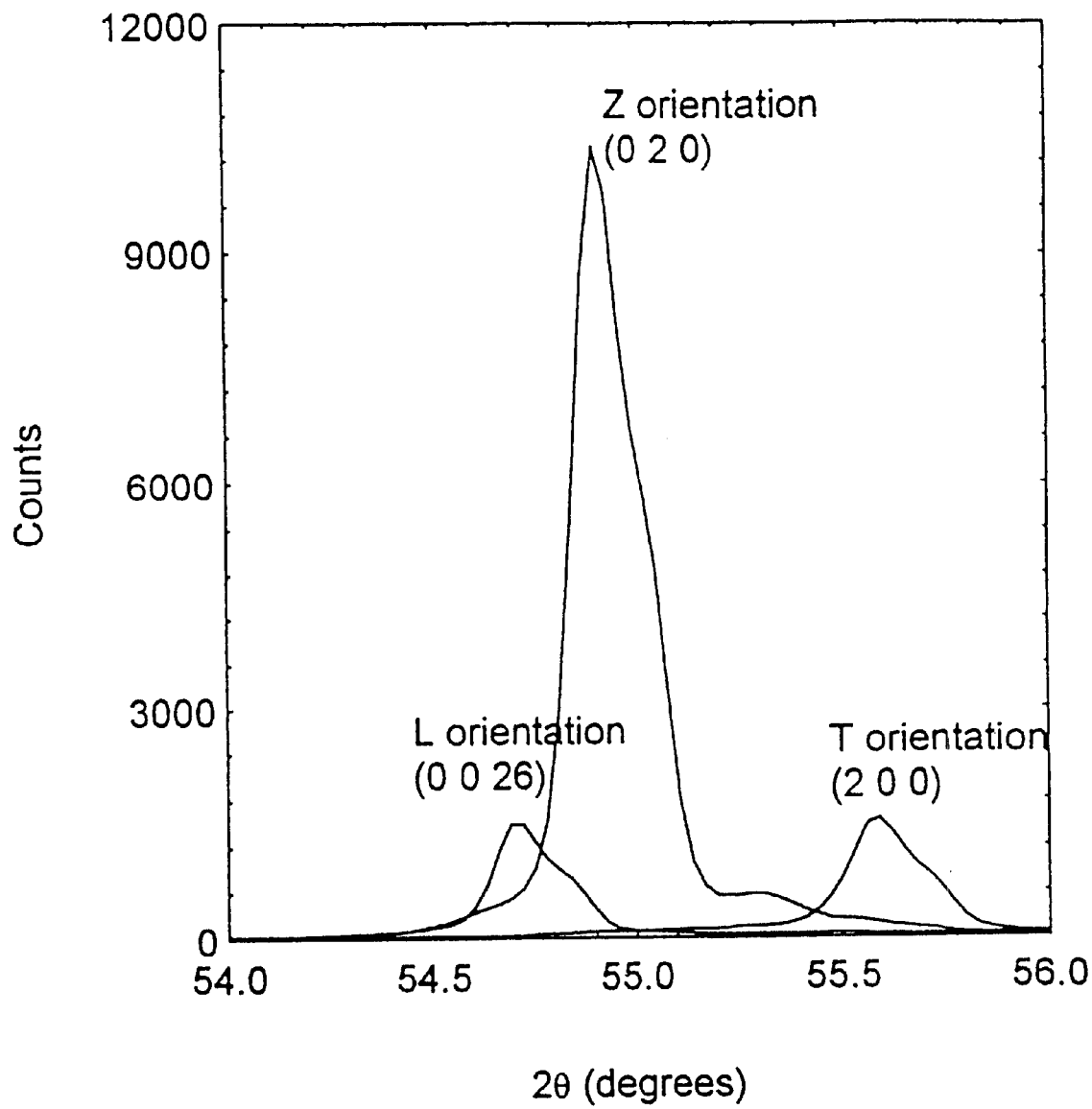
Figure 5C:
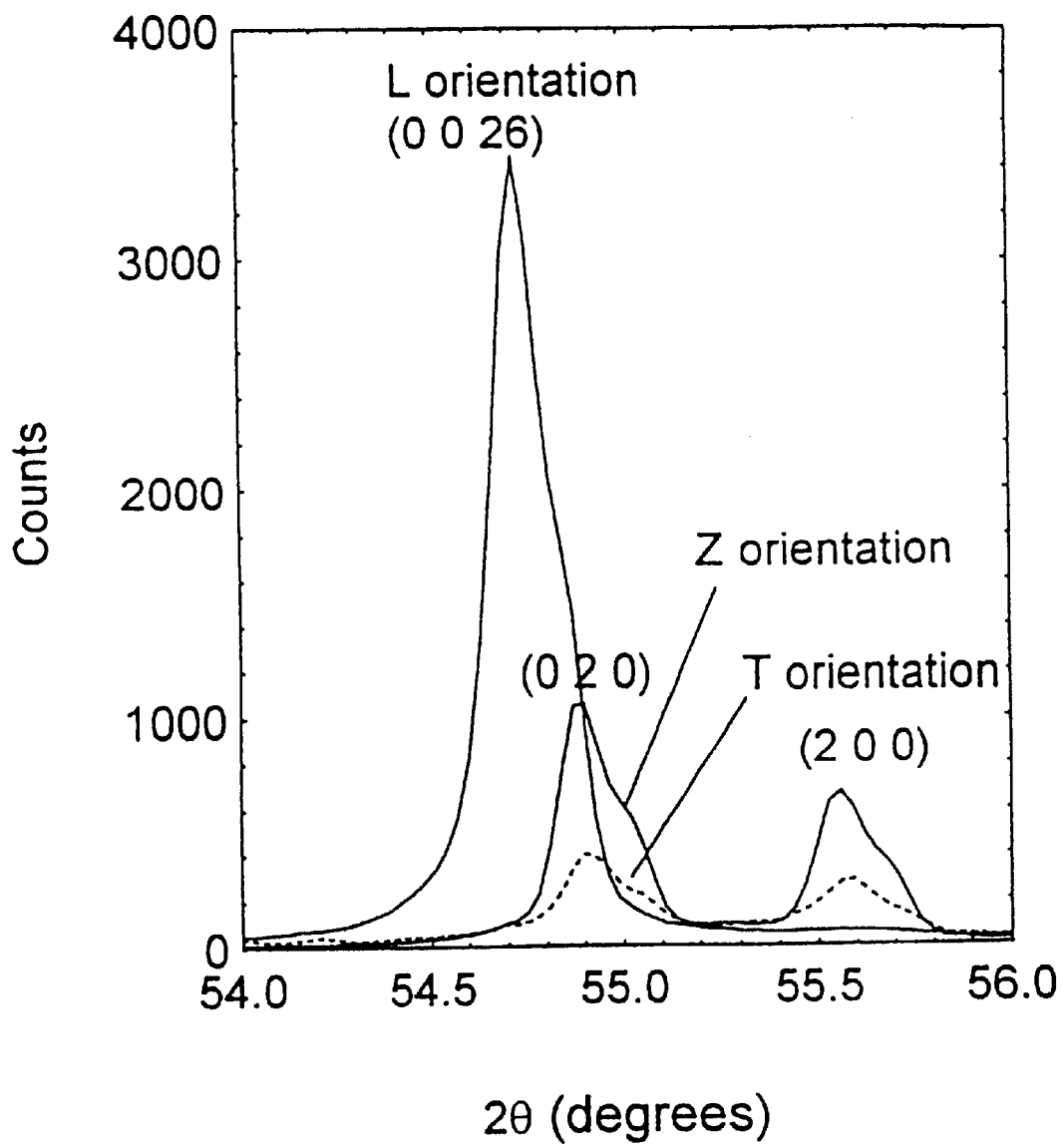
Figure 5D:
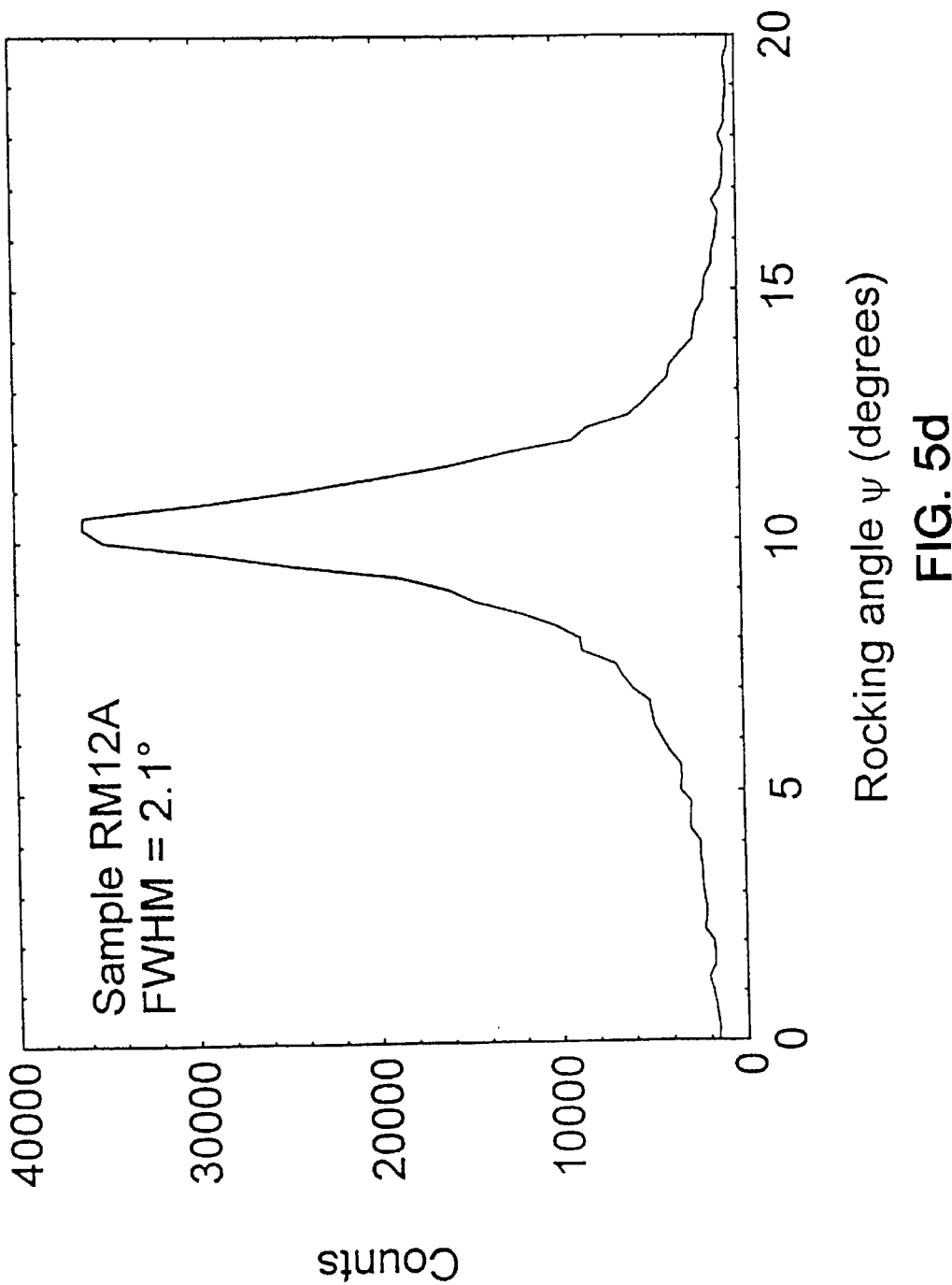

Biaxial alignment of $Dy_2Ba_4Cu_7O_{15-\delta}$(Dy-247) was achieved using applied magnetic fields alone. FIG. 5a shows x-ray diffractometer traces measured on a sample of Dy-247 cured in epoxy while being rotated in a horizontal 1 T field. After being held several minutes stationary in the field the mould containing the sample was rotated successively about a vertical axis to orientations rotation −90°, 0°, +90° and 0° with respect to its original orientation. The dwell time at 0° was of order 2 seconds, at the transverse orientations half this time. The trace in FIG. 5a labelled L shows the trace obtained on the sample face perpendicular to the field direction; the strong (ool) lines indicate c-axis texture. The traces labelled T and Z are for the surfaces respectively normal to the horizontal transverse direction and the vertical transverse direction. Any difference in these traces reveals a degree of biaxial alignment. Trace T is dominated by the (200) line, indicating a strong a-axis texture. Trace Z is dominated by the (020) line, indicating a strong b-axis texture. FIG. 5b shows these lines in greater detail and FIG. 5c shows the corresponding traces from a stationary sample which shows only uniaxial alignment. The biaxial texture obtained indicates that the magnitude of the susceptibility along the respective crystal axes reduces in the order CAB. By experimentation the following $R_2Ba_4Cu_7O_{15-\delta}$ compositions have been identified as CAB biaxial aligners: R=Y, Dy, Nd, as BAC biaxial aligners; R=Er, Eu, Yb; and as an ACB aligner: R=Gd. The precise grain orientation attainable using biaxial magnetic alignment is demonstrated by the rocking curve for the (0 2 0) diffraction line of a Y-247 sample aligned in epoxy. Shown in FIG. 5d. In this case the b-axis texture has a full width at half maximum of just over 2°.

EXAMPLE 2

Figure 6:
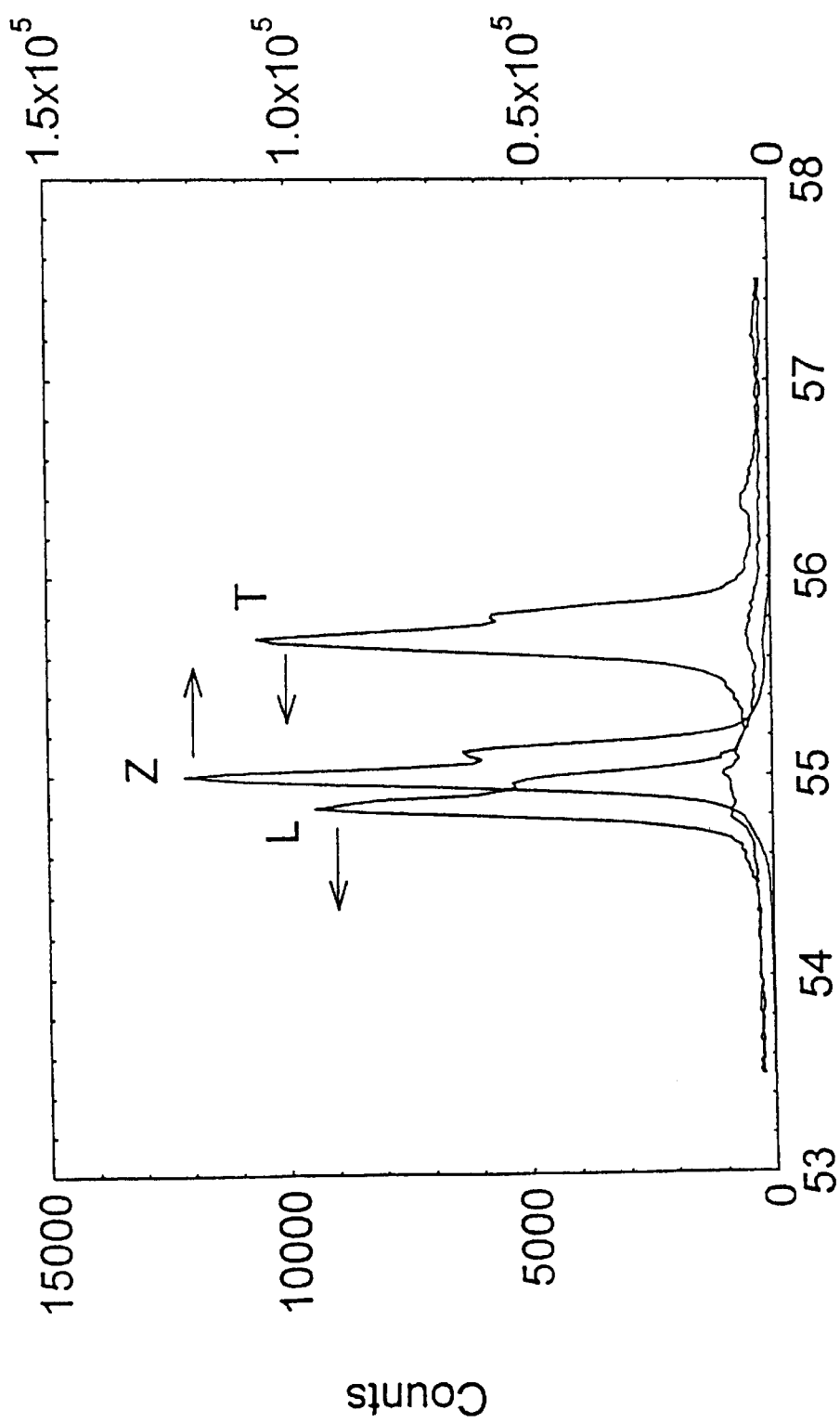
FIG. 6 shows XRD traces measured on a sample of $Y_3Ba_4Cu_7O_{15-\delta}$ biaxially textured as described in example 2—L, Z and T indicate as in FIGS. 5a to 5c.

Biaxial alignment of Y-247 grains in epoxy was achieved using a rotating field apparatus with the sample remaining stationary. A magnetic field of 0.85 T was produced in a 10 mm gap using pairs of NdFeB permanent magnets mounted in a steel yoke rotatable about a horizontal axis. The field was alternated between horizontal and vertical orientations at frequencies around 0.5 Hz. The ratio of time spent in the major field (L) orientation to time spent in the perpendicular (T) orientation was typically 2:1. Field alternation was continued for several hours while the epoxy set. FIG. 6 shows XRD traces recorded on mutually perpendicular surfaces with the L, Z, and T orientations as in Example 1, revealing a similar biaxial texture.

The invention has been generally described with reference to the biaxial alignment of HTSC material but may also be used to induce biaxial crystalline alignment in other crystalline materials having anisotropic magnetic susceptibility.

The foregoing descries the invention including preferred forms thereof. Alterations and modifications as will be obvious to those skilled in the art are intended to be incorporated within the scope hereof, as defined in the accompanying claims.

What is claimed is:

1. A method of inducing biaxial particle alignment in a body of crystalline particles having anisotropic magnetic susceptibility, so that at least a major portion of the crystalline particles have at least two crystalline axes generally parallel, comprising subjecting the particles to cycles of relative rotation between the body of crystalline particles and
   a magnetic field in a first direction relative to the body of crystalline particles, and
   a magnetic field in a second direction relative to the body of crystalline particles, which field in said second direction has a lower magnitude, or lower average magnitude over time, than the magnitude or average magnitude over time of said magnetic field in said first direction,
   said crystalline particles having freedom to move to align with said magnetic field, to thereby induce alignment of the axis of maximum magnetic susceptibility of the particles generally with said field in said first direction and an axis of lower magnetic susceptibility of the particles generally with said field in said second direction, and the crystalline particles being subjected to the magnetic field in said first direction in one orientation between the body of crystalline particles and the magnetic field, and for a time longer than the crystalline particles are subjected to the magnetic field in said second direction, in another such orientation.

2. A method according to claim 1, comprising causing said relative rotation by cyclically rotating said magnetic field relative to the body of crystalline particles.

3. A method according to claim 1, comprising causing said relative motion by cyclically rotating said body of crystalline particles relative to said magnetic field.

4. A method according to claim 1, wherein said first direction and said second direction are substantially perpendicular to one another.

5. A method according to claim 4, wherein the strength of the field in said first direction and/or second direction also varies with time.

6. A method according to claim 1 including causing relative transitional movement between the body of crystalline particles and a series of magnets oriented alternately in said first and then said second directions.

7. A method according to claim 6, wherein the body of crystalline particles is moved relative to said series of magnets.

8. A method according to either one of claim 6 or 7, wherein said first direction and said second direction are substantially perpendicular to one another.

9. A method of inducing biaxial particle alignment in a body of crystalline particles having anisotropic magnetic susceptibility, so that at least a major portion of the crystalline particles have at least two crystalline axes generally parallel, comprising the steps of
   subjecting the particles to cycles of:
   a magnetic field in a first direction relative to the body of crystalline particles, and
   a magnetic field in a second direction relative to the body of crystalline particles, which field in said second direction has a lower magnitude, or lower average magnitude over time, than the magnitude or average magnitude over time of said magnetic field in said first direction,
   said crystalline particles having freedom to move to align with said magnetic field, to thereby induce alignment of the axis of maximum magnetic susceptibility of the particles generally with said field in said first direction and an axis of lower magnetic susceptibility of the particles generally with said field in said second direction; and
   creating and varying said field in said first direction and said field in said second direction by pulsing each of an electromagnet oriented in said first direction and an electromagnet oriented in said second direction relative to the body of crystalline particles.

10. A method of inducing biaxial particle alignment in a body of crystalline particles having anisotropic magnetic susceptibility, so that at least a major portion of the crystalline particles have at least two crystalline axes generally parallel, comprising subjecting the particles to repeated alternating cycles between a magnetic field in a first direction relative to the body of crystalline particles and a magnetic field in a second direction relative to the body of crystalline particles and which is generally orthogonal to said first direction, with the strength of said magnetic field in said first direction and the strength of said magnetic field in said second direction rleative to one another, or the time for which the particles are subjected to said magnetic field in said first direction relative to the time for which the particles are subjected to said magnetic field in said second direction, being such that over said repeated alternating cycles between said magnetic field in said first direction and said magnetic field in said second direction, said magnetic field in said second direction has a lower average magnitude over time that the average magnitude over time of said magnetic field in said first direction, said crystalline particles have freedom to move to align with said magnetic field, to thereby induce alignment of said axis of maximum magnetic susceptibility of at least a major portion of the particles generally with said field in said first direction and an axis of lower magnetic susceptiblity of the particles generally with said field in said second direction.

11. A method according to claim 10, comprising subjecting the particles to said repeated alternating cycles by causing cycles of relative rotation between the body of crystalline particles and a magnetic field so that the crystalline particles are subjected to the magnetic field in said first direction in one orientation between the body of crystalline particles and the magnetic field, and to the magnetic field in said second direction in another orientation between the body of crystalline particles and the magnetic field, and such that the body of crystalline particles is subjected to the magnetic field in said first direction for a time longer than the crystalline particles are subjected to the magnetic field in said second direction in each cycle.

12. A method according to claim 11, comprising causing said relative rotation by cyclically rotating means providing said magnetic field relative to the body of crystalline particles.

13. A method according to claim 11, comprising causing said relative rotation by cyclically rotating said body of crystalline particles relative to said magnetic field.

14. A method according to claim 10 comprising subjecting the particles to said repeated alternating cycles by creating said magnetic field in said first direction with a first electromagnet and said magnetic field in said second direction with a second electromagnet and pulsing said electromagnets alternately, and pulsing said first electromagnet for a time longer than said second electromagnet in each cycle or pulsing said first electromagnet so as to generate a magnetic field of higher strength than the magnetic field generated by said second electromagnet in each cycle.

15. A method according to claim 10 comprising subjecting the particles to said repeated alternating cycles by causing relative translational movement between the body of crystalline particles and a series of magnets oriented alternatively in said first and then said second directions.

16. A method according to claim 15, wherein the body of crystalline particles is moved relative to said series of magnets.

* * * * *